(12) United States Patent
Toya et al.

(10) Patent No.: US 6,204,488 B1
(45) Date of Patent: Mar. 20, 2001

(54) SEALING TERMINAL

(75) Inventors: Eiichi Toya; Tomio Konn; Tomohiro Nagata; Norihiko Saito; Sunao Seko, all of Oguni-machi; Hideyuki Yokoyama, Iide-machi; Ken Nakao, Sagamihara; Takanori Saito, Sagamihara; Hisaei Osanai, Sagamihara; Toshiyuki Makiya, Tokyo, all of (JP)

(73) Assignees: Toshiba Ceramics Co., Ltd; Tokyo Electron Limited, both of Tokyo (JP)

( * ) Notice: Subject to any disclaimer, the term of this patent is extended or adjusted under 35 U.S.C. 154(b) by 0 days.

(21) Appl. No.: 09/450,755

(22) Filed: Nov. 30, 1999

(30) Foreign Application Priority Data

Nov. 30, 1998 (JP) .................................................. 10-356919

(51) Int. Cl.$^7$ ...................................................... H05B 3/00
(52) U.S. Cl. ..................... 219/541; 219/444.1; 219/458.1
(58) Field of Search ................................ 219/541, 444.1, 219/458.1, 459.1, 544, 460.1; 338/322; 118/724–725

(56) References Cited

U.S. PATENT DOCUMENTS 5,231,690 * 7/1993 Soma et al. ........................... 392/416
5,753,891 * 5/1998 Iwata et al. .......................... 219/390

FOREIGN PATENT DOCUMENTS 5-89947 * 4/1993 (JP) .

* cited by examiner

Primary Examiner—John A. Jeffery
(74) Attorney, Agent, or Firm—Foley & Lardner

(57) ABSTRACT

A sealing terminal includes internal connection lines which are connected to heating elements and external connection lines via which power is supplied. A quartz glass body includes a plurality of grooves in its outer surface to retain the internal and external connection lines in place. Conductive foils are used to connect the internal and external lines which are housed in a quartz glass tube so that the ends of the lines project out of the respective ends thereof. A plug is disposed in the lower end of the tube to close the same. Spark generation is prevented while a low electrical resistance sealed terminal which is simple in structure and quick and easy to assemble, results.

16 Claims, 7 Drawing Sheets

SEALING TERMINAL

BACKGROUND OF THE INVENTION

The present invention relates to a sealing terminal and more particularly to a sealing terminal used for a heater having a heating element sealed in a quartz member.

In a process of semiconductor manufacturing, a silicon wafer or the like is subjected to various heat treatments.

Such heat treatments require not only strict temperature control but also a clean atmosphere which is free from particles including fine dusts.

For this purpose, the heater for such heat treatments is required to show uniform heating performance and superior temperature rising and decreasing control capabilities as well as non-emission of polluting matters such as particles.

As one example of the heater for manufacturing semiconductors, there is known a type in which a heating element is sealed in a support member of quartz glass or the like together with a non-oxidizing gas.

The inventors once developed a superior heater for subjecting semiconductors to heat treatments; that is, fine carbon mono filaments bound into a plurality of carbon fiber bundles, which are woven into a carbon wire heating element which in turn is sealed in a quartz glass support member together with a non-oxidizing gas. Said heater is already proposed in Japanese Patent Application H10-254513.

Said carbon wire heating element has such a smaller heat capacity than metallic counterparts that it shows less temperature fluctuation as well as an excellent high temperature resistance in a non-oxidizing atmosphere.

Moreover, since a plurality of fine carbon mono filaments are woven in the manufacture of said carbon wire heating element, it has a remarkable flexibility as compared with a heating element of solid carbon member such that it has an advantage in term of structural variety and workability.

Therefore, said heating element sealed in a heat resistant clean support member of high purity quartz glass or the like together with a non-oxidizing gas will not produce particles and is most suitable as a heater for the semi-conductor manufacturing as stated in the foregoing.

In this connection, the heater which uses the carbon wire element as a heating element requires a terminal device for connection between terminal wires composed of carbon heater bundles and metal wires. The inventors proposed some terminal devices in the above mentioned earlier application.

With reference to FIGS. 7 and 8, the outline of such heaters and terminal devices proposed in said earlier application will be explained.

A carbon heater 50 has substantially an integral structure prepared by sealing a pair of heater members 51 (carbon wire heating element) in a plate-like quartz glass support member 52.

Although not shown, said plate-like quartz glass support member 52 is formed with spaces within which heater elements 51 are accommodated.

Said heater element 51 is in contact with said spaces by way of the carbon fibers having a fluffed surface.

Further, the heater element 51 has its end substantially drawn perpendicularly to a heater face 52a and is connected to a molybdenum (Mo) terminal line 54 by way of a carbon terminal 53 and a connector 58.

Further, said molybdenum (Mo) terminal line 54 is connected to a pair of molybdenum (Mo) terminal line 57 for outside connection by way of a plate-shaped molybdenum (Mo) foil 56.

In this connection, the molybdenum (Mo) foil 56 is pinch sealed by a quartz glass tube 55 together with the respective ends of said molybdenum terminal lines 54 and a pair of such external connection lines 57.

Further, said members are arranged in a glass tube 55 to constitute a sealing terminal.

Now then, said sealing terminal is required to have less electrical resistance to prevent sparks from being generated such that it is possible to supply power to the carbon heating element.

Said terminal structure will suffice the above requirements.

However, said sealing terminal is structured in such a way that the carbon terminal 53 is connected to the molybdenum (Mo) terminal line 54 and the external connection lines 57 by way of the connectors 58 to make the structure complicated and assembly thereof difficult.

Further, a compact sealing terminal is desired considering various devices to be arranged around near the heater.

SUMMARY OF THE INVENTION

The present invention has been made to solve the above mentioned-technical problems and its objective is to provide a compact and easy-to-assemble sealing terminal which has less electrical resistance to prevent sparks from being generated such that it is possible to supply power to the carbon heating element.

To realize the above objective, the sealed terminal according to the present invention is essentially characterized in comprising heating elements; internal connection lines to be electrically connected to said heating elements; external connection lines from which power is supplied; a glass body formed with a plurality of grooves in outer surfaces thereof to retain said internal and external connection lines therein; conductive foils to electrically connect said internal and external connection lines; a glass tube to accommodate therein said internal and external connection lines with end portions thereof projecting out of said glass tube, said glass tube being fused to said glass body at outer surfaces thereof; and a plug member to close said glass tube at an end thereof at least on the external connection line side.

It is preferable that said glass body and said glass tube are formed of quartz glass.

It is further preferable that said internal and external connection lines include two pairs of internal connection lines and external connection lines and that said internal and external connection lines include members made of either molybdenum or tungsten. In this case, it is even more preferable that the thickness of said molybdenum foils is 20 to 40 μm. The reason therefor is that the electrical resistance of less than 20 μm is too high and there is a likelihood of overheat to destroy the glass tube as a result of oxidization and expansion of the molybdenum foil. On the other hand, the electrical resistance of more than 40 μm causes the sealing performance between the glass body and the glass tube to be degraded and there is a likelihood of an air leaking to oxidize the molybdenum (Mo) terminal foil and the wire carbon terminal. Further, it is preferable that the plug member is made of a cement formed primarily of pulverized alumina cement material. Specifically, pulverized alumina is added to water which is dried until it is set.

It is further preferable that a heat resistant resin coated layer is formed between said glass body and said plug member, that said internal connection lines are provided at ends thereof with a retaining member made from opaque glass or foamed glass, where said retaining member is used to retain said internal connection lines in said glass tube, and that said opaque glass and said foamed glass are formed of quartz glass.

It is further preferable that said heating element is prepared by binding carbon fibers each having a diameter of 5 to 15 μm into a plurality of bundles and weaving said plurality of bundles into knitted cords, braids or the like.

It is further preferable that said carbon fibers contain less than 10 ppm of ash contents as impurities.

The sealing terminal of the invention is characterized in that the glass body is formed with grooves in outer surface thereof to retain the internal and external connection lines and that there are provided conductive foils to electrically connect said internal and external connection lines such that the glass body is accommodated within the glass tube.

Thus constructed, downsizing is realized more efficiently than the conventional flat molybdenum foils.

Moreover, the need for connectors is eliminated and mere insertion of the internal connection lines into terminal lines completes the work of electrical connection to simplify the operation.

DETAILED DESCRIPTION OF PREFERRED EMBODIMENTS

Hereinafter, a detailed explanation will be given with reference to the attached drawings.

Figure 1:
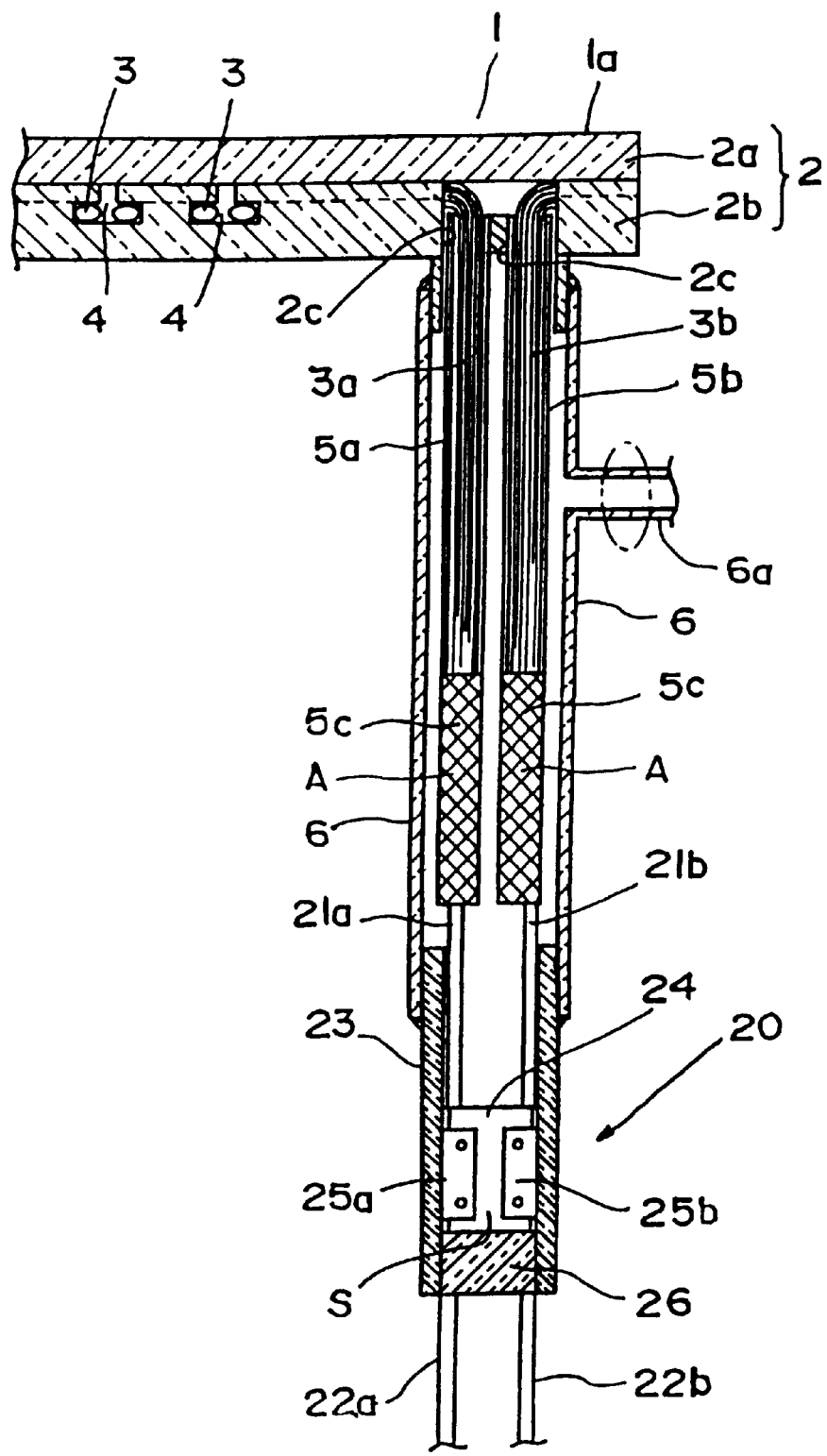
FIG. 1 is a partially sectional view of a heater in which a heating element is sealed and a sealing terminal according to the present invention is applied thereto.
Figure 2:
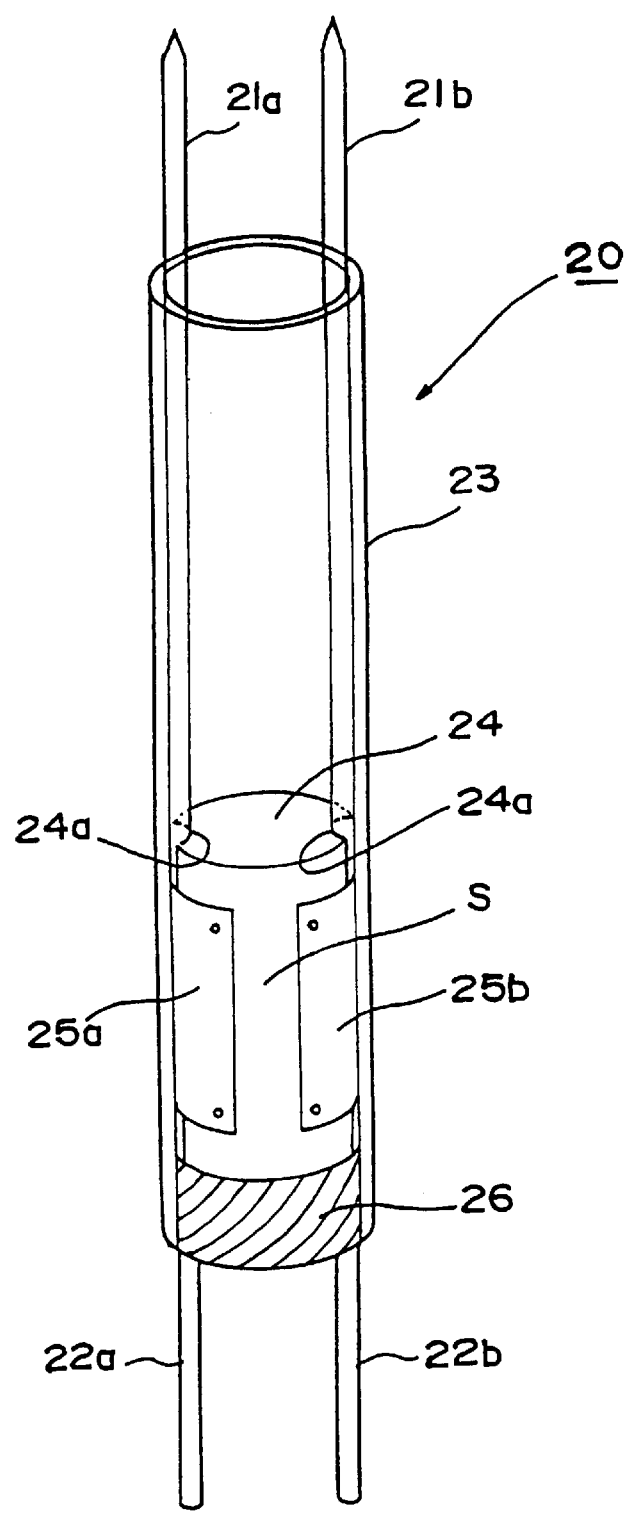
FIG. 2 is a perspective view of one embodiment of the present invention relating to the sealing terminal.
Figure 3:
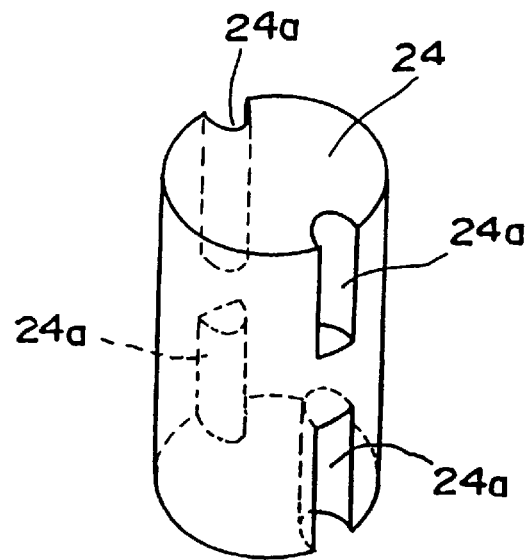
FIG. 3 is a perspective view of a quartz glass body to be used for the sealing terminal according to the present invention.
Figure 7:
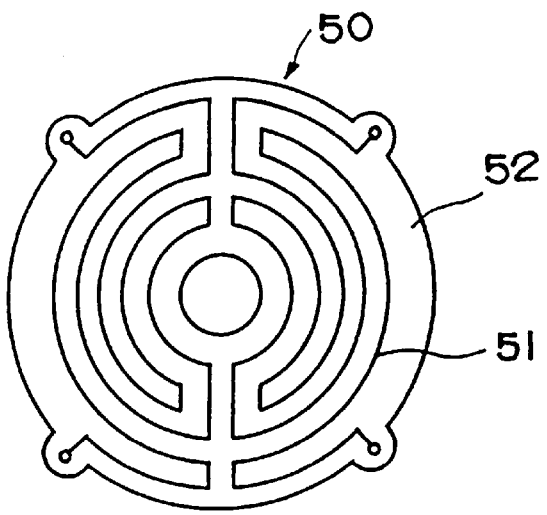
FIG. 7 is a plane view of the heater sealed with a heating element which the inventor proposed in the earlier application.
Figure 8:
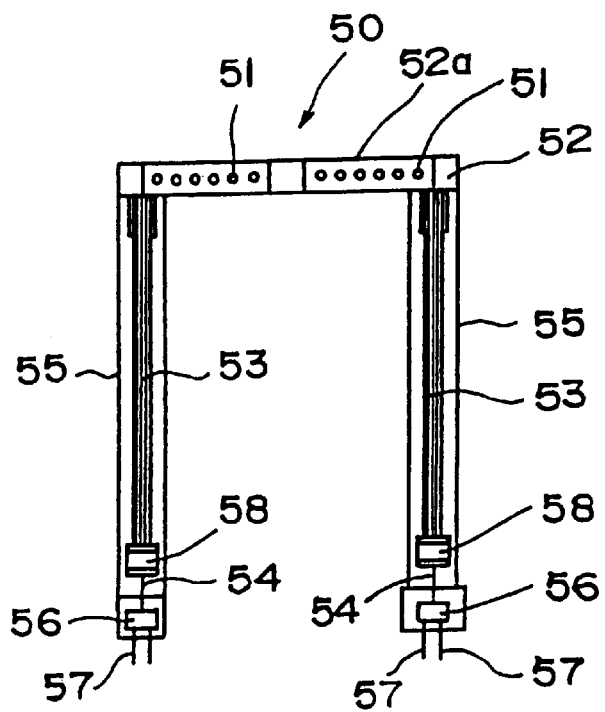
FIG. 8 is a cross section of FIG. 7.

In FIG. 1, a heater 1 in which a heating element is sealed has a heating face of a disk shape as shown in FIG. 7, with carbon wire heating elements 3 being sealed in a quartz glass support member 2.

For said carbon wire heating element 3, the one which is prepared by weaving a plurality of fiber bundles into a wire configuration is adopted, each fiber bundle being prepared of a plurality of carbon fibers.

As shown in FIG. 7, said carbon wire heating elements 3 are arranged in a so-called zigzag configuration on the face of the quartz glass support member 2.

However, the wiring arrangement in FIG. 7 may be changed freely and is not limited thereto.

Said quartz glass support member 2 is formed with spaces (substantially grooves 4) to enclose the carbon wire heating element 3. Except for the existence of said spaces, the quartz glass member 2 is fused into a substantially solid member.

Said quartz support member 2 is composed of plate-like quartz glass member (main member) 2b having an upper face formed with grooves in which the carbon wire heating elements 3 are accommodated, and a plate-like quartz glass member (seal cover plate) 2a to play the role of a cover to seal said grooves from above.

In other words, the quartz glass support member 2 is prepared by fusing together at bond faces of said plate-like quartz glass member (main member) 2b and a quartz glass member (seal cover plate) 2a, after said carbon wire heating elements 3 are arranged in said grooves, and the inside of said grooves are brought into a state of non-oxidizing atmosphere.

Now, a concrete example of wire carbon members A will be explained. Wire carbon members A are prepared by binding 300 to 350 carbon fibers, each having a diameter of 5–15 μm, for example, 7 μm, into a bundle, in the similar way as in said carbon wire. About 9 such bundles are woven into a wire carbon in the form of a knitted cord or a braid.

Thus, it is ensured that a tension strength required for a heating element at a high temperature is maintained with adhesion characteristics of the fibers being kept uniform in the longitudinal direction thereof, thus reducing the unevenness of heating in the longitudinal direction.

The reason for using a plurality of bundled carbon fibers each having a diameter of 5 through 15 μm is because a fiber of diameter less than 5 μm lacks sufficient strength to endure the weaving process into a heating element of a desired elongated shape. Further, such fibers are too fine to obtain a desired resistance unless too many strings of fibers are used, thus making use of such fibers unpractical.

On the other hand, there is a problem with carbon fibers having a diameter of more than 15 μm, which lacks resiliency and is not only difficult to weave if bound into plural bundles of carbon fibers, but also some of said bundled fibers can snap to remarkably lower the strength thereof.

In such a case, the weaving span of the carbon wire is 2 mm through 5 mm or thereabout while the surface fluffing of the carbon fibers is 0.5 through 2.5 mm high or thereabout.

Figure 9:
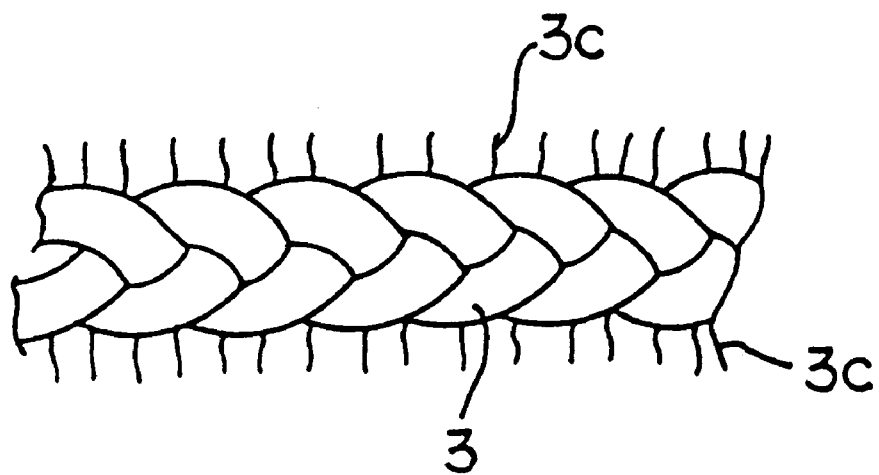
FIG. 9 is a view showing the outline of the carbon wire heater.

In this connection, said "fluffing" is a part of broken carbon wires projecting from the outer surface thereof as shown by the numeral 3c in FIG. 9.

The combination of each carbon wire heating element and the sealing terminal to be explained later provides the structure in which said carbon wire heating element are in contact with said quartz glass support member by way of said fluffing such that the partial degradation at a high temperature is prevented to minimize the unevenness of heating in a longitudinal direction. As a result, it is possible to provide a compact heater which is excellent in subsurface heating uniformity and suitable for the manufacture of semiconductors.

In the heater 1 sealed with the heating element of the present invention, a plurality of carbon wire heating elements 3 may be used and if a plurality of such carbon wire heating elements are used, the quality thereof in terms of heating characteristics are stabilized even more.

From a view point of heating uniformity, stability in durability and avoidance of dust generation, high purity carbon fibers are preferred. Particularly in case where the heater 1 is used for heat treatments of wafers in the production process of the semiconductors, the amount of impurities in said carbon fibers is preferred to be less than 10 ppm in terms of ash contents (Japanese Industrial Standards JIS R 7223-1979). Further, less than 3 ppm impurity contents is even more preferable.

The combination of such carbon wire heating element and the sealing terminals to be explained later will prevent the thermal diffusion of impurities into each quartz glass member which constitutes said carbon wire heating element and the sealed terminal. As a result, devitrification and degradation of the quartz glass member is prevented such that the service life of the sealing terminal is prolonged.

Said carbon wire heating element is preferably prepared by binding 100 through 800 carbon fibers each having a diameter of 5 through 15 μm into a bundle. Three or more such bundles, preferably 6 through 13 such bundles, are preferably woven into a longitudinal configuration such as a wire or a tape.

If less than 100 carbon fibers are bound, 6 through 12 such bundles are insufficient for securing a predetermined strength and resistance. Therefore, the weaving process in which sufficient number of bundles are to be woven, is made difficult.

In addition, with a small number of bundles, woven bundles can come loose as a result of partial breakage thereof to such an extent it is difficult to maintain the configuration.

With more than 800 fibers, on the other hand, less bundles are required to obtain a predetermined resistance and it is difficult to maintain the woven wire configuration.

Further, said carbon wire heating element is preferably designed to have electrical resistance of 1 through 20 Ω/m/piece at the temperature of 1,000° C.

The reason is that it is needed to match the heating element to the transformer capacity in a heating device for a general semiconductor manufacturing.

In other words, with the resistance being more than 20 Ω/m/piece, it is impossible to have a long heater due to its large resistance, in which the heat between the terminals is lost to cause a temperature unevenness.

On the other hand, with the resistance being less than 1 Ω/m/piece, it is required to have a longer heater more than necessary due to its small resistance. This makes it likely that a temperature unevenness can result due to the irregularity of structure and that of the ambient atmosphere often seen with a long heating element such as carbon wire, carbon tape or the like.

The electric resistance of said carbon wire heating element at the temperature of 1,000° C. is preferably set at 2 to 10 μ/m/piece in order to secure a high degree of reliability in terms of said characteristics.

The terminal lines 3a and 3b from said carbon wire heating element 3 are, for example, drawn out perpendicularly to the heater surface 1a from the opening 2c having a diameter of 10 mm formed in the main member 2b.

Said terminal lines 3a and 3b are accommodated in small diameter quartz glass tubes 5a and 5b, at whose end portions 5c, the terminal lines 3a and 3b are compressed by wire carbon members A to be accommodated therein.

More specifically, the terminal lines 3a and 3b of the carbon wire heating element 3 are compressed by a plurality of wire carbon members A arranged in parallel to the axial direction of the respective small diameter quartz glass tubes 5a and 5b at the end portions 5c thereof.

In this connection, said compressed accommodation is not limited to the end portions of the small diameter quartz glass tubes 5a and 5b but long wire carbon members A may be arranged along the entire length of said tubes.

Further, the concrete example of the wire carbon members A will be explained as follows. A plurality of carbon fibers similar to said carbon wire heating element 3 each having a diameter of 5 to 15 μm, for example, about 300 to 350 carbon fibers each having a diameter of 7 μm are bound into a bundle and 9 such bundles are woven into knitted cord, a braid or the like having a diameter of about 2 mm.

In this case, the weaving span of the carbon wire is 2 to 5 mm or thereabout while the surface fluffing of the carbon wire is 0.5 to 2.5 mm high or thereabout.

In this connection, said "fluffing" means part of broken carbon fibers projecting from the outer surface of the carbon wire as shown by numeral 3c in FIG. 9.

The wire carbon members A are preferably made from the same or at least a similar material as that of the carbon wire heating element 3 considering that they ae in a shape of a knitted cord or a braid. In this connection, the "same" preferably means being of the same carbon fiber diameter, the same number of bound carbon fibers, the same number of fiber bundles, the same knitting method, the same weaving span, the same fluffing and the same material.

And if the carbon wires are used for heat treatment of wafers in the semiconductor manufacturing process like in the case of the carbon wire heating element 3, it is preferable that the amount of impurities contained in the carbon fibers of the wire carbon members A is less than 10 ppm in terms of ash contents. The amount of such impurities contained in the carbon fibers is more preferably less than 3 ppm in terms of ash contents.

Then, the number of the wire carbon members A accommodated in opposite end portions 5c of the small diameter quartz glass tubes 5a and 5b is preferably equal to or more than that of the carbon wire heating element 3. It is even more preferable if there are five or more wire carbon members A for every carbon wire heating element 3.

Specifically, in order to make the number of carbon members A more than five times that of carbon wire heating element, provide, for example fourteen wire carbon members A for one carbon wire heating element 3, or twelve wire carbon members A for two carbon wire heating element 3.

Further, a large diameter quartz glass tube 6 is provided outside said small diameter quartz glass tubes 5a and 5b such that one end thereof is hermetically fused to enclose the opening 2c from which the terminal lines 3a and 3b of the carbon wire heating element 3 are drawn out.

In this connection, the flank of the large diameter quartz glass tube 6 is provided with a branch pipe 6a to introduce nitrogen gas for preventing the carbon wire heating element 3 from being oxidized. Said branch pipe 6a may also be used for reducing the internal pressure of the heater and the terminal.

Now then, an explanation will be given to the sealed terminal 20.

Said sealed terminal 20 is comprised of internal connection lines 21a and 21b to be connected to terminal lines 3a and 3b accommodated in small diameter quartz glass tubes 5a and 5b; external connection lines 22a and 22b to be connected to a power source not shown; a quartz glass tube 23 having a diameter either to be inserted into or receive said large diameter quartz glass tube 6; a quartz glass body 24 accommodated to fit the inside wall of said quartz glass tube 23; molybdenum (Mo) foils 25a and 25b, which are conductive foils for electrical connection of internal and external connection lines retained around the outer surface of the quartz glass body 24; a plug member 26 to close the end of said quartz glass tube 23.

In this connection, said large diameter quartz glass tube 6 and quartz glass tube 23 may be made of an equal diameter and be fused together at butt ends thereof.

Further, said quartz glass body 24 may be solid or hollow.

Said internal connection lines 21a and 21b and external connection lines 22a and 22b may be made of molybdenum (Mo) or tungsten (W) rod with its diameter being sized 1 through 3 mm. The diameters of said internal connection lines 21a and 21b and said external connection lines 22a and 22b may be chosen as necessary provided that a diameter smaller than 1 mm is not preferable in view of high electrical resistance.

On the other hand, too large diameters are not preferable, either, because the size of the terminal itself becomes too large.

Said internal connection lines 21a and 21b have pointed tips such that said internal connection lines are easily connected to the terminal lines 3a and 3b compressed and accommodated within the small diameter quartz glass tubes 5a and 5b, by merely inserting it thereinto.

In this case, the insertion depth is preferably 10 mm or more to assure physical and electrical coupling to the terminals 3a and 3b.

Further, tip ends of the internal connection lines 21a and 21b and those of the external lines 22a and 22b are accommodated in grooves 24a formed in the outer surface of said quartz glass body 24 to retain said internal and external connection lines therein such that the outer surfaces of said accommodated internal and external connection lines will not protrude from the outer surface of said quartz glass body 24.

Further, said internal connection lines 21a, 21b and said external connection lines 22a, 22b are electrically insulated from each other by said quartz glass body when accommodated in said grooves 24a and electrically connected by said molybdenum (Mo) foils 25a and 25b which will be explained later.

Said molybdenum (Mo) foils 25a and 25b are attached to the outer surface of said quartz glass body 24 so as to extend therealong such that said internal connection lines 21a and said external connection lines 22a as well as said internal connection lines 21b and said external connection lines 22b are electrically connected.

Said molybdenum (Mo) foils 25a and 25b are spaced apart from each other by a distance S to avoid electrical short circuiting.

Although the molybdenum (Mo) foil are used for a conductive purpose, another material such as tungsten (W) foil may be used in place thereof, provided that molybdenum (M) foils are preferable in terms of resiliency.

Further, for a blocking material to plug the end of said quartz glass tube 23, a cement member composed of pulverized alumina ($Al_2O_3$) is charged.

Said cement member is prepared by adding water to pulverized alumina ($Al_2O_3$) and dry setting it at the temperature of 200° C.

Said molybdenum (Mo) foils 25a and 25b react with oxygen or moisture at a temperature higher than 350° C. to be oxidized and at the time of such oxidization, the volume thereof expands.

Said plug member 26 prevents the molybdenum (Mo) foils 25a and 25b from expanding by blocking the outer atmosphere such that the quartz glass tube 23 is prevented from being broken.

As a plug member, resin or a cement using pulverized SiO2 may be used instead of said cement ($Al_2O_3$) member but it is preferable to use a cement member using alumina ($Al_2O_3$) as a main ingredient in view of heat resistance and preventing the formation of dry cracks.

Next, the method of manufacturing the sealed terminal will be explained.

First, a generation of gas is eliminated by a predetermined heat treatment before the molybdenum foils 25a, the internal connection lines 21a, and the external connection lines 22a are spot welded.

In other words, the external connection lines 22a, the internal connection line 21a, and molybdenum foil 25a, having an 8 mm width and a 35 $\mu$m thickness, are connected and secured.

In a similar fashion, the molybdenum (Mo) foil 25b, the internal connection line 21b and the external connection line 22b are spot welded.

Then, the thus connected external connection line 22a and the internal connection line 21a are assembled by being accommodated in the groove 24a formed in the outer periphery of the quartz glass member 24.

Then, the thus assembled quartz glass body 24 is inserted far into the quartz glass tube 23 formed longer than the final sealed terminal for easy degasification.

After the insertion, the quartz glass tube 23 is softened by heating with an acid hydrogen acid gas burner from outside thereof at a portion where said quartz glass member 24 is located.

At this time, since the inside pressure of said quartz glass tube 23 is reduced, the quartz glass tube 23 is press fitted to the quartz glass body 24 by the atmospheric pressure until it is fused.

Then, the plug member 26 is loaded to the end of the external connection line 22a of said quartz glass tube 23 to close it.

After said plug member 26 is dried and set, degasification is conducted by means of a vacuum pump from above such that the inside of the quartz glass tube 23, which is formed slightly longer is made vacuum, becomes a vacuum.

The sealed terminal manufactured with the above method is free from a gas leakage between the internal connection line 21a and 21b and the external connection line 22a and 22b, which are thus separated.

Next, the manner in which the sealed terminal manufactured with said method is attached to the heater 1, in which the heating element is sealed, is explained.

1) First, while a nitrogen gas is injected through to flow into the side pipe 6a, the large diameter quartz glass tube 6 is weld attached to the main member 2b constituting the quartz glass support member 2.

At this time, an appropriate annealing treatment is conducted to prevent cracking.

2) The terminal lines 3a and 3b composed of plural carbon wires are drawn into the small diameter glass tube 5a and 5b with the aid of strings.

Then, said small diameter quartz glass tube 5a and 5b are inserted into attachment holes 2c in the main member 2.

In this connection, the carbon wire terminal lines 3a and 3b are guided into the small diameter quartz tubes 5a and 5b and compressed by the plurality of wire carbon members A within and all through the insides of the small diameter quartz tubes 5a and 5b.

Thereby, any generation of sparks are prevented effectively.

3) Each member is arranged as shown in FIG. 1 such that the large diameter quartz glass tube 6 is welded to the lower part of the main member 2b while oxidization of the carbon wire heating element 3 and the terminal lines 3a and 3b is prevented by injecting nitrogen gas thereinto nitrogen gas from the side pipe 6a.

4) The sealed terminal 20 manufactured in the manner as previously explained is inserted from below into the large diameter quartz glass tube 6, such that the internal connection lines 21a and 21b are inserted into said terminal lines 3a and 3b for electrical connection.

5) Then, nitrogen gas is injected thereinto from the side pipe 6a while the large diameter quartz glass tube 6 and the sealed terminal 20 is fused together at connections thereof for attachment of the sealing terminal.

6) Thereafter, vacuum pumping is conducted from said side pipe 6a to reduce the pressure inside the heater.

Thereafter, said side pipe 6a is subjected to a flame fusing operation to seal the heater and then the side pipe is removed, thus completing the attachment of the sealed terminal 20.

As detailed in the foregoing, the sealed terminal according to the present invention contributes to downsizing more effectively as compared to the conventional method in which a plate-like molybdenum foil is used because the present invention is characterized by the grooves which are formed in the outside surface of the glass body to accommodate said internal and external connection lines, while a conductive foil to connect said internal and external connection lines is provided along the outside surface of said glass body such that said glass body is accommodated within the glass tube.

Moreover, the present invention eliminates the need for the conventional connectors and mere insertion of internal connection lines into the terminal lines is sufficient to realize a simplified electrical connection and an easy assembly.

Next, an explanation will be given for a modification of the first embodiment with reference to FIG. 4 and FIG. 5.

Figure 4:
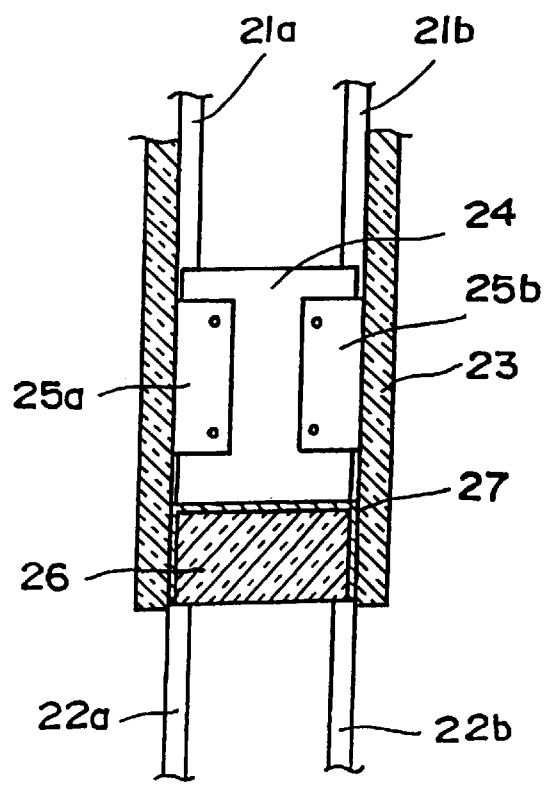
FIG. 4 is a sectional view of one modification of the embodiment of the present invention.

The modification shown in FIG. 4 is formed with a resin coated layer 27 between the quartz glass body 24 and the plug member 26.

By providing the resin coated layer 27, contact of the moisture contained in the cement material of the plug member 26 with the molybdenum (Mo) foils 25a and 25b can be prevented. In other words, the molybdenum foils 25a and 25b can otherwise expand at the time of contact with moisture therewith. In order to prevent a fracture of the quartz glass tube 23 by such expansion, said resin coated layer 27 is provided.

As the material for the heat resistant resin coated layer, silicon or teflon may be used provided that the former is preferred.

Said heat resistant resin coated layer is prepared by applying a liquid-state resin material to the internal surface of the external line side of the small diameter glass tube in which a plug member is arranged and also to the external line side of the quartz glass body 24 and drying said resin material. In view of workability, silicon is preferred.

The presence of said heat resistant resin coated layer makes it possible to prevent the molybdenum external connection lines or the molybdenum foils from oxidizing due to aqueous vapor generated at the time the solvent used for forming said plug member is evaporated.

Figure 5:
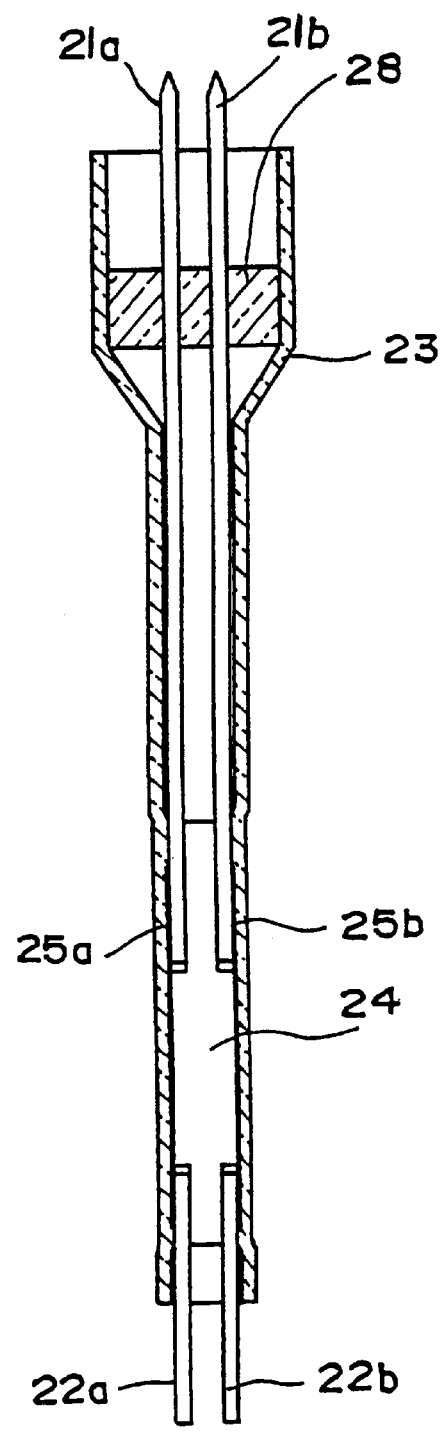
FIG. 5 is a sectional view of another modification of the embodiment of the present invention.

Next, the modification shown in FIG. 5 has a foamed and opaque quartz glass retaining member 28 to retain said internal connection lines 21a and 21b at end portions thereof.

The thus provided retaining member 28 prevents said internal connection lines 21a and 21b from deforming at the time of being inserted into terminal lines 3a and 3b. Said retaining member 28 also shield a heat from the heating element side to prevent the degrading of the structure in which the quartz glass tube 23 and the quartz glass member 24 are fused together. Said retaining membdr 28 may also be made of opaque glass.

Further, other forms of use of the sealing terminal according to the present invention will be explained with reference to FIG. 6.

Figure 6:
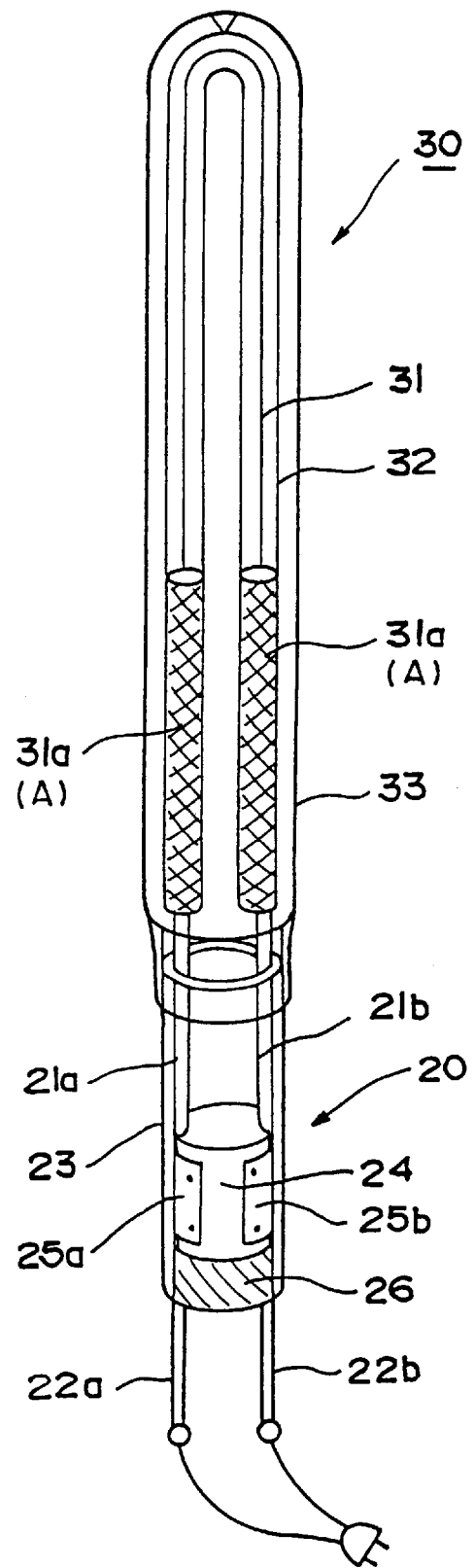
FIG. 6 is a perspective view of the rod-shaped heater with the sealing terminal of the present invention being applied.

The sealing terminal 20 shown in FIG. 6 provides an application in a rod-shaped heater 30.

Said rod-shaped heater 30 includes a small diameter quartz glass tube 32 to accommodate a carbon wire heating element 31; a large diameter quartz glass tube 33 to accommodate said small diameter quartz glass tube 32; and the sealing terminal 20 to be inserted into said carbon wire heating element 31 of said small diameter quartz glass tube 32 such that a large diameter quartz glass tube 23 is fused to the large diameter quartz glass tube 33.

The numeral 31a in the figure denotes the portion where the carbon wire heating element 31 is compressed to be accommodated in said small diameter glass tube 32.

Thus, said sealing heater 20 according to the present invention may be attached not only to the plate-shaped heater as seen in the first embodiment, but also to the rod-shaped heater 30.

The embodiments in the foregoing, glass was explained as a quartz glass but other types of glasses including high silica glass, borosilicate glass, aluminosilicate glass, soda-lime glass, lead glass or the like may be used, for example, as a material for a heater which heats the various solutions used for wet etching or grinding processes and control them at a low temperature, for example, below 100° C.

The sealing terminal according to the present invention has less electrical resistance and is capable of supplying power to the heating element without generating sparks.

Further, the sealing terminal according to the present invention has a simple structure and is easily assembled such that the attachment work is carried out in a short time.

Further, the sealing terminal according to the present invention realized the objective of downsizing and any limitation in the arrangement of devices near the heater is minimized.

Further, the combination of the carbon wire heating element and the sealing heater according to the present invention realizes an extremely compact and advantageous heater for semiconductor manufacturing which has an excellent subsurface heat uniformity.

What is claimed is:

1. A sealing terminal comprising
   heating elements;
   internal connection lines electrically connected to said heating elements;
   external connection lines from which power is supplied;
   a glass body formed with a plurality of grooves in outer surfaces thereof to retain said internal and external connection lines therein;
   conductive foils to electrically connect said internal and external connection lines;
   a glass tube to accommodate therein said internal and external connection lines with end portions thereof projecting out of said glass tube, said glass tube being fused to said glass body at outer surfaces thereof; and
   a plug member to close said glass tube at an end thereof at least on the external connection line side.

2. A sealing terminal as set forth in claim 1, wherein said glass body and said glass tube are formed of quartz glass.

3. A sealing terminal as set forth in claim 2, wherein said internal and external connection lines include two pairs of internal connection lines and external connection lines.

4. A sealing terminal as set forth in claim 2, wherein said internal and external connection lines include members made of either molybdenum or tungsten.

5. A sealing terminal as set forth in claim 2, wherein said conductive foils include molybdenum foils.

6. A sealing terminal as set forth in claim 2, wherein said plug member is made of a cement formed primarily of pulverized alumina cement material.

7. A sealing terminal as set forth in claim 1, wherein said internal and external connection lines include two pairs of internal connection lines and external connection lines.

8. A sealing terminal as set forth in claim 1, wherein said internal and external connection lines include members made of either molybdenum or tungsten.

9. A sealing terminal as set forth in claim 1, wherein said conductive foils include molybdenum foils.

10. A sealing terminal as set forth in claim 9, wherein a heat resistant resin coated layer is formed between said glass body and said plug member.

11. A sealing terminal as set forth in claim 9, wherein said heating element is prepared by binding carbon fibers each having a diameter of 5 through 15 $\mu$m into a plurality of bundles and weaving said plurality of bundles into one of knitted cords and braids.

12. A sealing terminal as set forth in claim 1, wherein said plug member is made of a cement formed primarily of pulverized alumina cement material.

13. A sealing terminal as set forth in claim 1, wherein said internal connection lines are provided at ends thereof with a retaining member made from opaque glass or foamed glass, where said retaining member is used to retain said internal connection lines in said glass tube.

14. A sealing terminal as set forth in claim 13, wherein said glass tube, said opaque glass, and said foamed glass are formed of quartz glass.

15. A sealing terminal as set forth in claim 13, wherein said carbon fibers contain less than 10 ppm of ash contents as impurities.

16. A sealing terminal as set forth in claim 1, wherein said heating element is prepared by binding carbon fibers each having a diameter of 5 through 15 $\mu$m into a plurality of bundles and weaving said plurality of bundles into one of knitted cords and braids.

\* \* \* \* \*